United States Patent
Lin et al.

(10) Patent No.: US 10,982,685 B2
(45) Date of Patent: Apr. 20, 2021

(54) HEAT DISSIPATION DEVICE

(71) Applicant: ASUSTeK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 141 days.

(21) Appl. No.: 16/255,978

(22) Filed: Jan. 24, 2019

(65) Prior Publication Data

US 2019/0249685 A1 Aug. 15, 2019

(30) Foreign Application Priority Data

Feb. 9, 2018 (CN) .......................... 201810131981.1

(51) Int. Cl.
| F04D 29/42 | (2006.01) |
| H05K 7/20 | (2006.01) |
| F04D 25/08 | (2006.01) |
| F04D 29/16 | (2006.01) |
| F04D 27/00 | (2006.01) |

(52) U.S. Cl.
CPC ......... *F04D 29/4226* (2013.01); *F04D 25/08* (2013.01); *F04D 27/002* (2013.01); *F04D 29/162* (2013.01); *H05K 7/20172* (2013.01)

(58) Field of Classification Search
CPC ............... G06F 1/203; H05K 7/20172; H05K 7/20154; H05K 5/0239; F04D 29/4226; F04D 29/626; F04D 17/16

See application file for complete search history.

(56) References Cited

U.S. PATENT DOCUMENTS

| 2,823,598 A | * | 2/1958 | Jenn | .................... F24F 7/025 |
| | | | | 454/346 |
| 7,262,964 B1 | * | 8/2007 | Barsun | ............... H05K 7/20154 |
| | | | | 165/104.33 |
| 2013/0115066 A1 | | 5/2013 | Lin et al. | |
| 2015/0098844 A1 | * | 4/2015 | Hsu | ....................... F04D 25/062 |
| | | | | 417/354 |

FOREIGN PATENT DOCUMENTS

| CN | 202280632 U | * | 6/2012 |
| CN | 104564829 A | | 4/2015 |
| CN | 106122089 A | | 11/2016 |
| TW | 201319407 A | | 5/2013 |
| TW | M529761 | | 10/2016 |

\* cited by examiner

*Primary Examiner* — Justin D Seabe
(74) *Attorney, Agent, or Firm* — McClure, Qualey & Rodack, LLP

(57) ABSTRACT

The disclosure provides a heat dissipation device, including an enclosure, a connective member, and a fan module. The enclosure includes a first cover body and a second cover body that are opposite to each other. The second cover body includes an opening. The connective member is connected to one of the first cover body and the second cover body in the enclosure. The fan module is movably connected to the connective member, and is configured to move between a first position and a second position relative to the enclosure based on the connective member. When moving to the first position, the fan module is located in the enclosure.

7 Claims, 6 Drawing Sheets

HEAT DISSIPATION DEVICE

CROSS-REFERENCE TO RELATED APPLICATION

This application claims the priority benefit of China Application Serial No. 201810131981.1, filed on Feb. 9, 2018. The entirety of the above-mentioned patent application is hereby incorporated by reference herein and made a part of specification.

BACKGROUND OF THE INVENTION

Field of the Invention

The disclosure relates to a heat dissipation device, and in particular, to a heat dissipation device including a fan module.

Description of the Related Art

For a general system, a fan is disposed in a housing of the system, and an airflow channel is provided between the fan and the housing, so that an airflow passes through the airflow channel to enter or leave the fan, and exchanges heat to provide heat dissipation.

Because the inner space of the system housing is limited, to reserve an airflow channel, the size of the fan is limited. Therefore, when the system needs to increase the size of the fan to improve heat dissipation efficiency, the airflow channel between the fan and the housing is narrowed down, causing an increase in the resistance of flowing of the airflow, and resulting in a decrease in an overall heat dissipation capability of the system.

BRIEF SUMMARY OF THE INVENTION

The disclosure provides a heat dissipation device, including an enclosure, a connective member, and a fan module. The enclosure includes a first cover body and a second cover body that are opposite to each other. The second cover body includes an opening. The connective member is connected to one of the first cover body and the second cover body in the enclosure. The fan module is movably connected to the connective member, and is configured to move between a first position and a second position relative to the enclosure based on the connective member. When moving to the first position, the fan module is located in the enclosure.

In conclusion, in the heat dissipation device of the disclosure, the fan module moves between the first position and the second position relative to the enclosure based on the connective member in the enclosure, to change the size of an airflow channel between the fan module and the enclosure. When moving to the first position, the fan module is located in the enclosure. In actual application, the heat dissipation device of the disclosure does not operate when the fan module moves to the first position, and operates when the fan module moves to the second position. Therefore, when the fan module is at the first position, the heat dissipation device of the disclosure does not need to reserve any airflow channel for the fan module. Therefore, a fan module having a relatively large size is used to completely fill the airflow channel. When the fan module is at the second position, the fan module having a relatively large size is not limited by the enclosure, and the heat dissipation capability is maintained.

To make the foregoing features and advantages of the disclosure more comprehensible, a detailed description is given below with reference to the accompanying drawings by using embodiments.

DETAILED DESCRIPTION OF THE EMBODIMENTS

Figure 1A:
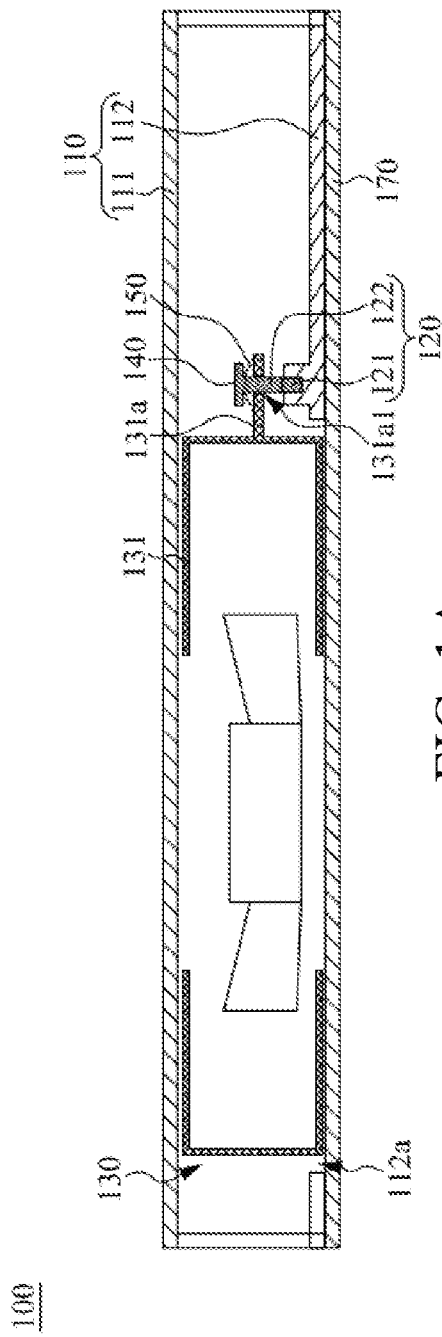
FIG. 1A is a cross-sectional view of a heat dissipation device according to an embodiment of the disclosure, where a fan module is at a first position.

A plurality of embodiments of the disclosure is disclosed below by using drawings. For the purpose of clarity, many details are described together below. However, it should be understood that the details are not intended to limit the disclosure. That is, in some embodiments of the disclosure, these details are not necessary. In addition, for the purpose of brevity, some known structures and elements will be shown in the drawings in simple forms.

Figure 1B:
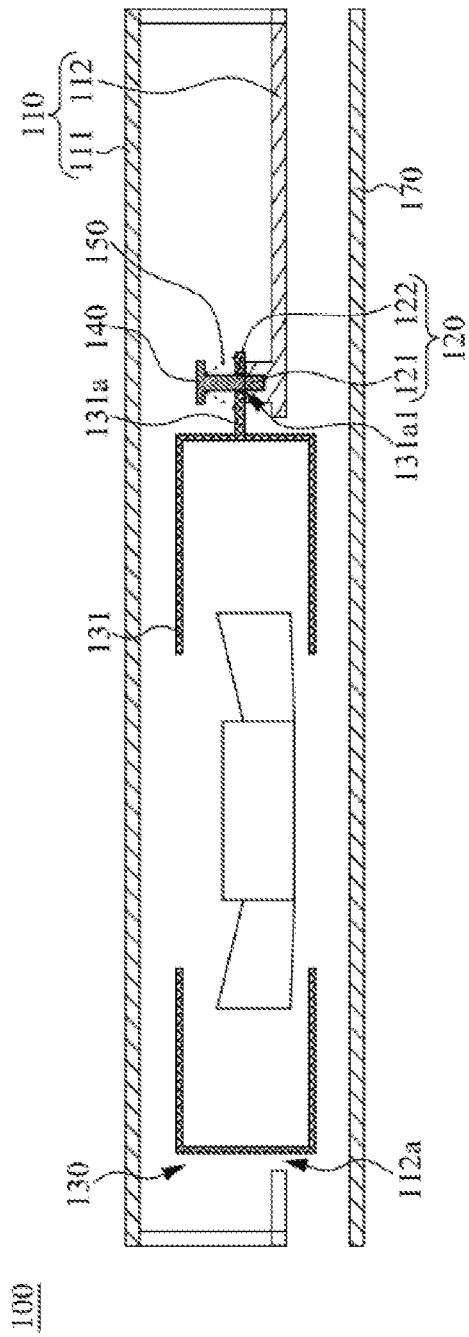
FIG. 1B is another cross-sectional view of the heat dissipation device in FIG. 1A, where the fan module is at a second position.

Refer to FIG. 1A and FIG. 1B. FIG. 1A is a cross-sectional view of a heat dissipation device 100 according to an embodiment of the disclosure, where a fan module 130 is at a first position. FIG. 1B is another cross-sectional view of the heat dissipation device 100 in FIG. 1A, where the fan module 130 is at a second position. In some embodiments, the fan module 130 is a centrifugal fan or an axial fan, but the disclosure is not limited thereto. The following will describe structures and functions of elements included in the heat dissipation device 100, and a connection relationship and an action relationship between the elements in detail.

As shown in FIG. 1A and FIG. 1B, in this embodiment, the heat dissipation device 100 includes an enclosure 110, a connective member 120, and a fan module 130. The enclosure 110 includes a first cover body 111 and a second cover body 112 that are opposite to each other. The second cover body 112 includes an opening 112a. The connective member 120 is connected to the second cover body 112 in the enclosure 110. The fan module 130 is movably connected to the connective member 120, and is configured to move between a first position (as shown in FIG. 1A) and a second position (as shown in FIG. 1B) relative to the enclosure 110 based on the connective member 120. When moving to the first position, the fan module 130 is located in the enclosure 110.

In some embodiments, as shown in FIG. 1A and FIG. 1B, the heat dissipation device 100 further includes an outer cover 170. The outer cover 170 is configured to selectively close or leave the second cover body 112. Therefore, in actual application, when closing the second cover body 112, the outer cover 170 seals the opening 112a and pushes the fan module 130 to move to the first position. When the outer cover 170 leaves the second cover body 112, the fan module 130 is allowed to move to the second position.

In the heat dissipation device 100 of this embodiment, the fan module 130 moves between the first position and the second position relative to the enclosure 110 based on the connective member 120 in the enclosure 110, to change the size of an airflow channel between the fan module 130 and the enclosure 110 (that is, an airflow channel between the first cover body 111 and the fan module 130 and an airflow channel between the outer cover 170 and the fan module 130). In an embodiment, the heat dissipation device 100 does not operate when the fan module 130 moves to the first position, and operates when the fan module 130 moves to the second position. Therefore, when the fan module 130 is at the first position, the heat dissipation device 100 does not need to reserve any airflow channel for the fan module 130 (that is, the fan module 130 is closely attached to the first cover body 111 at the first position), so that a fan module 130 having a relatively large size is used to completely fill the airflow channel. When the fan module 130 is at the second position, the fan module 130 having a relatively large size is not limited by the enclosure 110.

As shown in FIG. 1A and FIG. 1B, the fan module 130 includes a frame 131. The frame 131 includes an extension portion 131a. The extension portion 131a is provided with a punch 131a1. The connective member 120 includes a connection portion 121 and a body portion 122. The connection portion 121 is detachably connected to the second cover body 112. The body portion 122 is connected to the connection portion 121, and is slidably connected to the punch 131a1. The heat dissipation device 100 further includes a first stop member 140. The first stop member 140 is connected to the connective member 120. The extension portion 131a is limited between the second cover body 112 and the first stop member 140.

In an embodiment, the connective member 120 and the first stop member 140 are an integrated positioning screw, and the connection portion 121 has an external thread and is threaded into the second cover body 112. However, the disclosure is not limited thereto. In another embodiment, the connective member 120 is integrated with the second cover body 112, and the first stop member 140 is a buckle detachably connected to the connective member 120.

In this embodiment, the heat dissipation device 100 further includes a pushing member 150. The pushing member 150 is disposed in the enclosure 110, and is, in an embodiment, disposed between the extension portion 131a and the first stop member 140, and is configured to push the extension portion 131a to move the fan module 130 toward the second position. In this way, when the outer cover 170 leaves the second cover body 112, the pushing member 150 immediately pushes the fan module 130 to the second position.

In this embodiment, the pushing member 150 is a tower-shaped spring. In this way, when the fan module 130 moves to the first position (as shown in FIG. 1A), the pushing member 150 is relatively flatwise compressed between the extension portion 131a and the first stop member 140, so that a relatively small space is occupied and impact on a moving stroke of the fan module 130 relative to the enclosure 110 is reduced.

Figure 2:
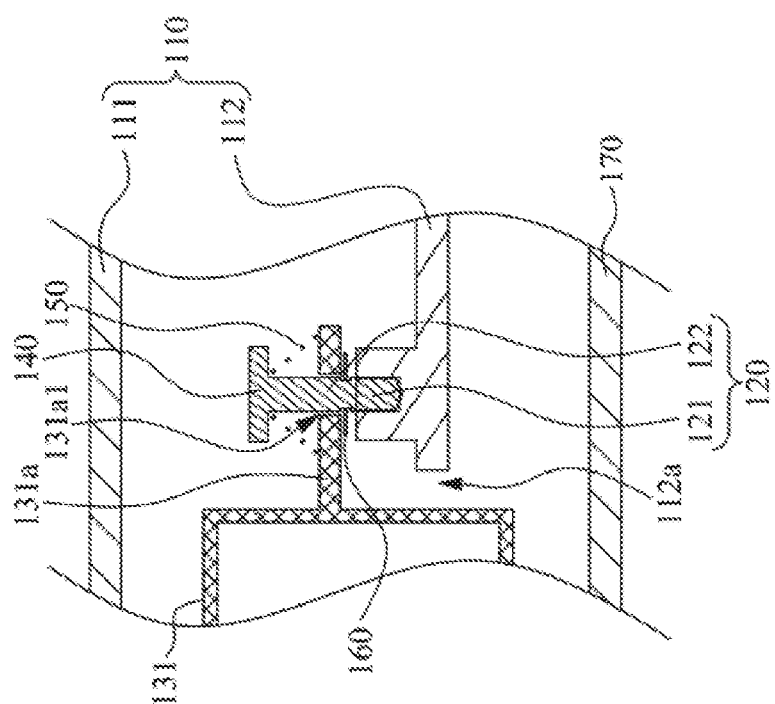
FIG. 2 is a partial cross-sectional view of a heat dissipation device according to another embodiment of the disclosure, where a fan module is at a second position.

Referring to FIG. 2, FIG. 2 is a partial cross-sectional view of a heat dissipation device 100 according to another embodiment of the disclosure, where a fan module 130 is at a second position. As shown in FIG. 2, in this embodiment, elements such as a connective member 120, a first stop member 140, and a pushing member 150 are integrated into one assembly on a frame 131 of the fan module 130. The heat dissipation device 100 in this embodiment further includes a second stop member 160. The second stop member 160 is connected to the connective member 120. An extension portion 131a is further limited between the first stop member 140 and the second stop member 160.

In this embodiment, the connective member 120 and the first stop member 140 are an integrated positioning screw, and the second stop member 160 is a buckle detachably connected to the connective member 120.

Figure 3:
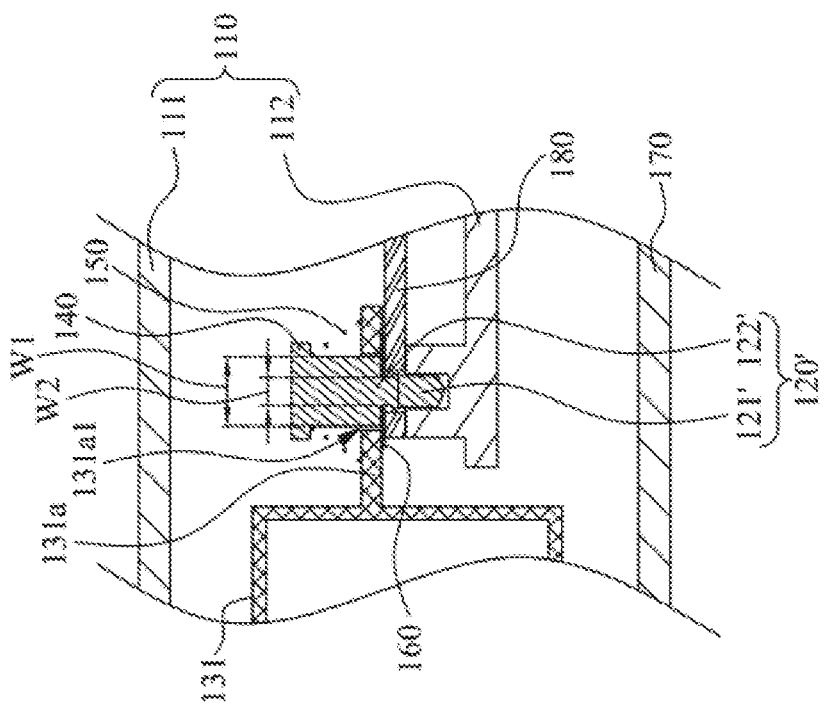
FIG. 3 is a partial cross-sectional view of a heat dissipation device according to another embodiment of the disclosure, where a fan module is at a second position.

Referring to FIG. 3, FIG. 3 is a partial cross-sectional view of a heat dissipation device 100 according to another embodiment of the disclosure, where a fan module 130 is at a second position. As shown in FIG. 3, a difference between this embodiment and the embodiment shown in FIG. 2 is that a second stop member 160 in this embodiment is further configured to fix, between the second stop member 160 and a second cover body 112, an interior element 180 located in an enclosure 110. That is, a distance exists between the second stop member 160 and the second cover body 112, so that the interior element 180 is clamped between the second stop member 160 and the second cover body 112.

In this embodiment, compared with the connective member 120 in the embodiment shown in FIG. 2, a difference is that in a radial direction of a connective member 120' in this embodiment, a body portion 122' and a connection portion 121' respectively have a first width W1 and a second width W2. In one embodiment the first width W1 is greater than the second width W2. The second stop member 160 abuts against an end face that is of the body portion 122' and that is close to the connection portion 121'. In this way, when the interior element 180 is clamped between the second stop member 160 and the second cover body 112, the body portion 122' having a relatively long width reinforces fixing.

Figure 4:
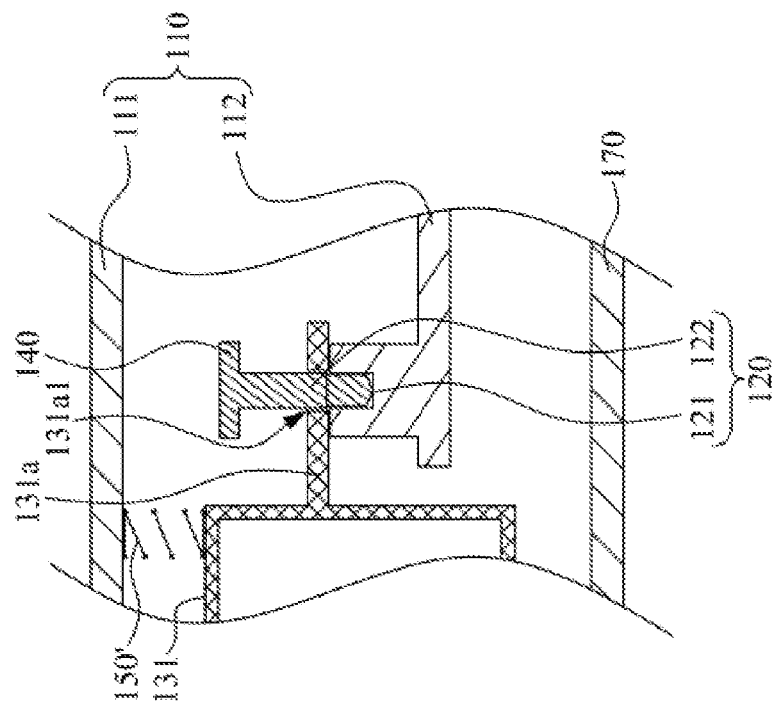
FIG. 4 is a partial cross-sectional view of a heat dissipation device according to another embodiment of the disclosure, where a fan module is at a second position.

Referring to FIG. 4, FIG. 4 is a partial cross-sectional view of a heat dissipation device 100 according to another embodiment of the disclosure, where a fan module 130 is at a second position. Except that a second stop member 160' in this embodiment is also configured to fix an interior element 180 located in an enclosure 110 between the second stop member 160' and a second cover body 112, differences between this embodiment and the embodiment shown in FIG. 2 include that a connective member 120 and the second stop member 160' in this embodiment are an integrated positioning screw, and a first stop member 140' is a buckle detachably connected to the connective member 120. The connective member 120 is integrated with the second stop member 160'. Therefore, the second stop member 160' sufficiently fixes the interior element 180.

Figure 5:
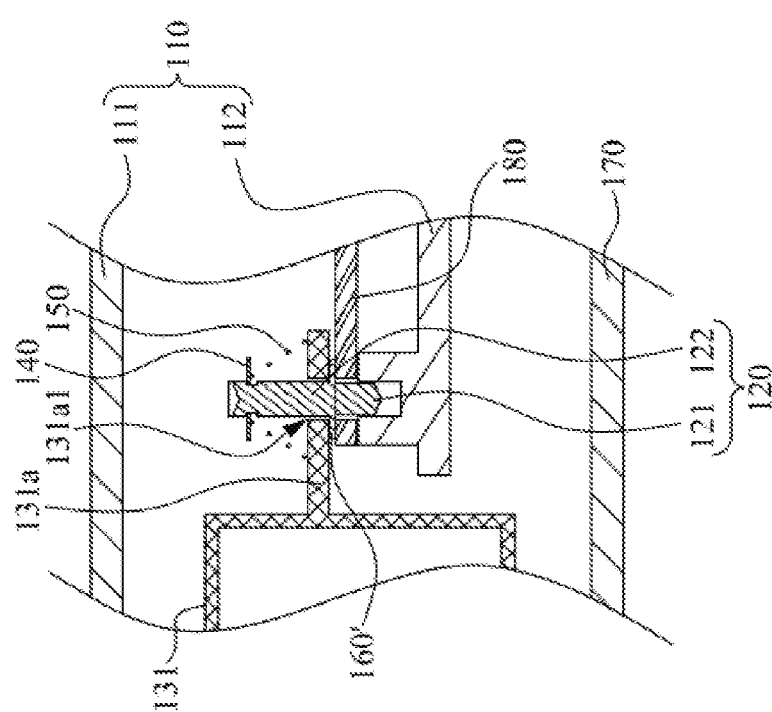
FIG. 5 is a partial cross-sectional view of a heat dissipation device according to another embodiment of the disclosure, where a fan module is at a second position.

Referring to FIG. 5, FIG. 5 is a partial cross-sectional view of a heat dissipation device 100 according to another embodiment of the disclosure, where a fan module 130 is at a second position. A difference between this embodiment and the embodiment shown in FIG. 1B is that in this embodiment, a pushing member 150' is disposed between a first cover body 111 and a frame 131. In this way, the pushing member 150' also pushes the fan module 130 to move toward the second position.

Figure 6A:
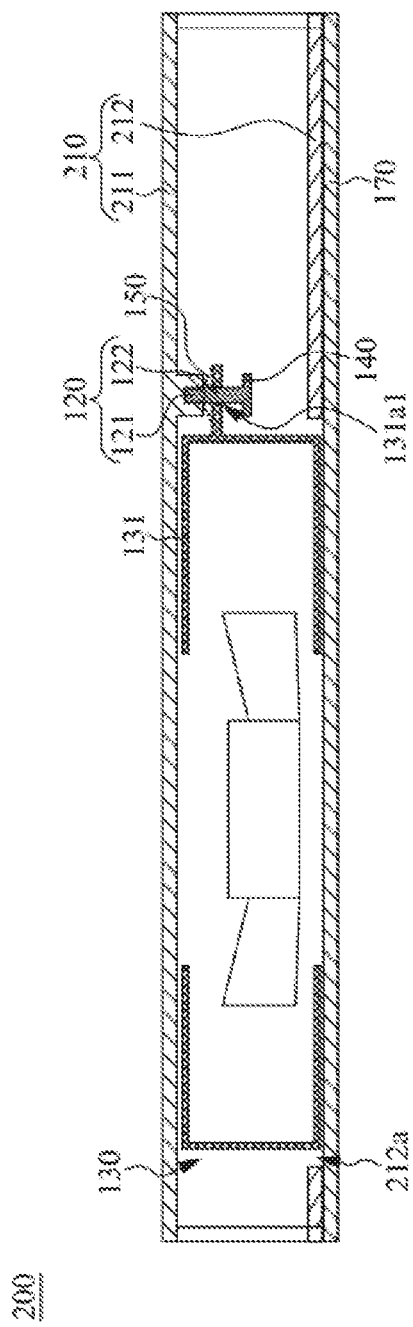
FIG. 6A is a cross-sectional view of a heat dissipation device according to an embodiment of the disclosure, where a fan module is at a first position.
Figure 6B:
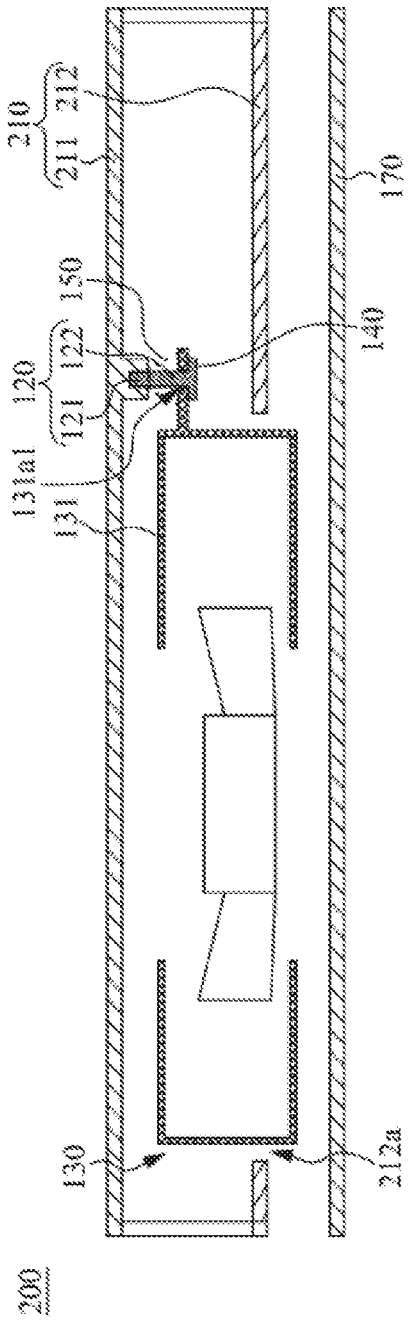
FIG. 6B is another cross-sectional view of the heat dissipation device in FIG. 6A, where the fan module is at a second position.

Refer to FIG. 6A and FIG. 6B. FIG. 6A is a cross-sectional view of a heat dissipation device 200 according to an embodiment of the disclosure, where a fan module 130 is at a first position. FIG. 6B is another cross-sectional view of the heat dissipation device 200 in FIG. 6A, where the fan module 130 is at a second position. In this embodiment, the heat dissipation device 200 includes: an enclosure 210, a connective member 120, the fan module 130, a first stop member 140, a pushing member 150, a second stop member 160, and an outer cover 170. The connective member 120, the fan module 130, the first stop member 140, the pushing member 150, the second stop member 160, and the outer cover 170 are the same as those in the embodiment shown in FIG. 1A. Therefore, the foregoing related descriptions are referred. As described above, when moving to the first position, the fan module 130 is located in the enclosure 210. When moving to the second position, the fan module 130 partially extends beyond the enclosure 210 through an opening 212a. A difference between this embodiment and the embodiment shown in FIG. 1A is that the connective member 120 in this embodiment is connected to a first cover body 211 rather than a second cover body 212 in the enclosure 210, and an extension portion 131a is limited between the first cover body 211 and the first stop member 140.

Figure 7:
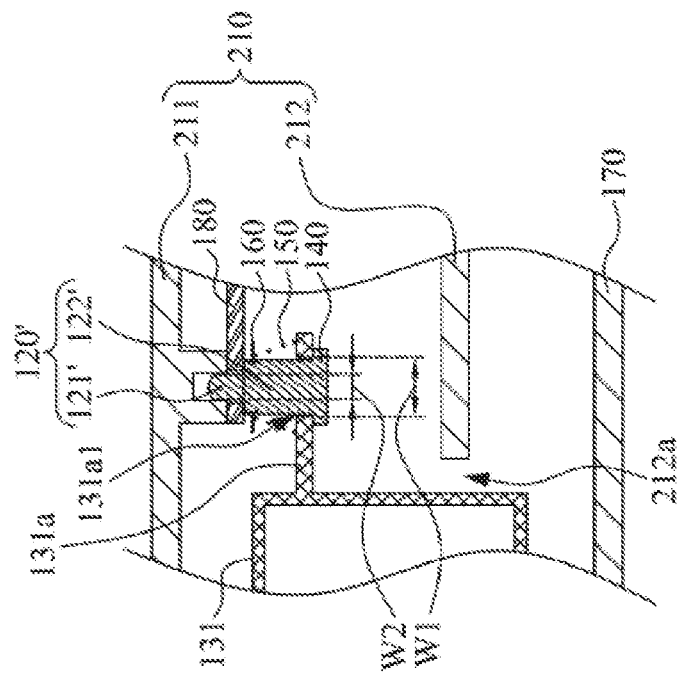
FIG. 7 is a partial cross-sectional view of a heat dissipation device according to another embodiment of the disclosure, where a fan module is at a second position.

Referring to FIG. 7, FIG. 7 is a partial cross-sectional view of a heat dissipation device 200 according to another embodiment of the disclosure, where a fan module 130 is at a second position. Compared with the embodiment shown in FIG. 6, in the heat dissipation device 200 in this embodiment, elements such as a connective member 120, a first stop member 140, and a pushing member 150 are integrated into one assembly on a frame 131 of the fan module 130 by using a second stop member 160. For a connection relationship between these elements, refer to the descriptions of the embodiment shown in FIG. 2.

Figure 8:
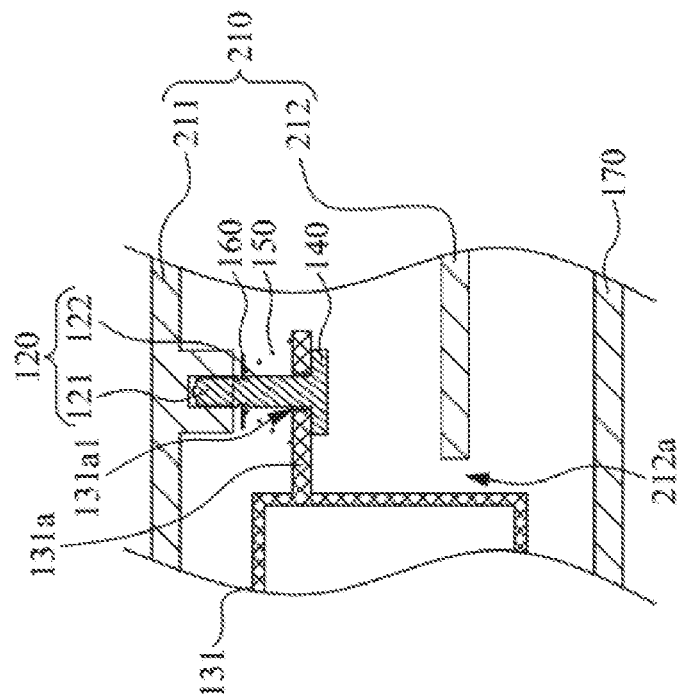
FIG. 8 is a partial cross-sectional view of a heat dissipation device according to another embodiment of the disclosure, where a fan module is at a second position.

Referring to FIG. 8, FIG. 8 is a partial cross-sectional view of a heat dissipation device 200 according to another embodiment of the disclosure, where a fan module 130 is at a second position. As shown in FIG. 8, a difference between this embodiment and the embodiment shown in FIG. 7 is that a second stop member 160 in this embodiment is further configured to fix, between the second stop member 160 and a first cover body 211, an interior element 180 located in an enclosure 210. That is, a distance exists between the second stop member 160 and the first cover body 211, so that the to-be-fixed interior element 180 is clamped between the second stop member 160 and the first cover body 211.

In a radial direction of a connective member 120' in this embodiment, a body portion 122' and a connection portion 121' respectively have a first width W1 and a second width W2. In one embodiment, the first width W1 is greater than the second width W2. The second stop member 160 abuts against an end face that is of the body portion 122' and that is close to the connection portion 121'. In this way, when the interior element 180 is clamped between the second stop member 160 and the first cover body 211, the body portion 122' having a relatively long width reinforces fixing.

Figure 9:
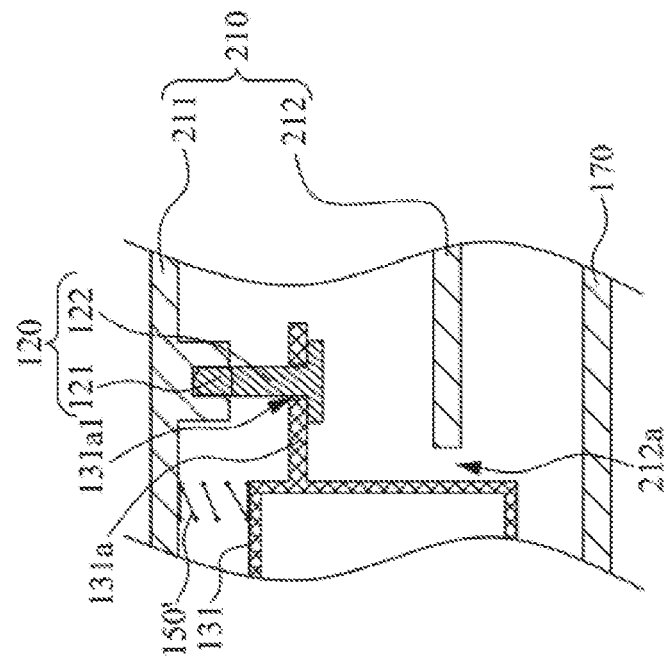
FIG. 9 is a partial cross-sectional view of a heat dissipation device according to another embodiment of the disclosure, where a fan module is at a second position.

Referring to FIG. 9, FIG. 9 is a partial cross-sectional view of a heat dissipation device 200 according to another embodiment of the disclosure, where a fan module 130 is at a second position. Except that a second stop member 160' in this embodiment is also configured to fix an interior element 180 located in an enclosure 210 between the second stop member 160' and a first cover body 211, differences between this embodiment and the embodiment shown in FIG. 6 include that a connective member 120 and the second stop member 160' in this embodiment are an integrated positioning screw, and a first stop member 140' is a buckle detachably connected to the connective member 120.

Figure 10:
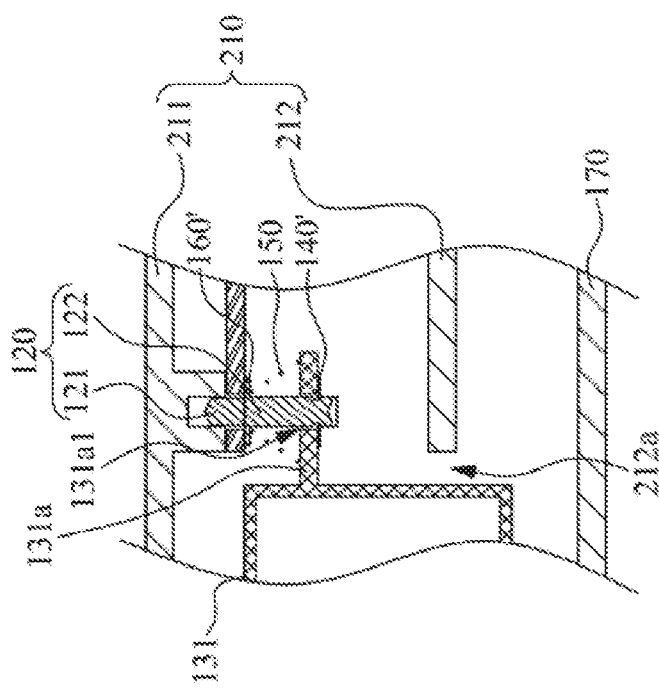
FIG. 10 is a partial cross-sectional view of a heat dissipation device according to another embodiment of the disclosure, where a fan module is at a second position.

Referring to FIG. 10, FIG. 10 is a partial cross-sectional view of a heat dissipation device 200 according to another embodiment of the disclosure, where a fan module 130 is at a second position. A difference between this embodiment and the embodiment shown in FIG. 6B is that in this embodiment, a pushing member 150' is disposed between a first cover body 211 and a frame 131, so that the pushing member 150' pushes the fan module 130 to move toward the second position.

Although the disclosure is disclosed above by way of embodiments, the embodiments are not intended to limit the disclosure. A person of ordinary skill in the art can make some changes and modifications without departing from the spirit and scope of the disclosure. Therefore, the protection scope of the disclosure shall be subject to the protection scope of the claims.

What is claimed is:

1. A heat dissipation device, comprising:
   an enclosure, comprising a first cover body and a second cover body that are opposite to each other, wherein the second cover body comprises an opening;
   a connective member, located in the enclosure and connected to one of the first cover body and the second cover body;
   a fan module, movably connected to the connective member, and moving between a first position and a second position relative to the enclosure, wherein when moving to the first position, the fan module is located in the enclosure, wherein the fan module further comprises a frame, the frame comprises an extension portion and a punch located on the extension portion, the connective member is slidably connected to the punch;
   a first stop member, connected to the connective member, wherein the extension portion is limited between the first cover body and the first stop member, or is limited between the second cover body and the first stop member;
   a second stop member, connected to the connective member, wherein the extension portion is further limited between the first stop member and the second stop member; and
   a pushing member, disposed between the extension portion and the second stop member, and configured to push the extension portion to move the fan module toward the second position, wherein the connective member is connected to the first cover body.

2. The heat dissipation device according to claim 1, wherein a distance exists between the second stop member and the first cover body or the second cover body.

3. The heat dissipation device according to claim 1, wherein the connective member comprises:
   a connection portion, detachably connected to the first cover body or the second cover body; and
   a body portion, connected to the connection portion, and slidably connected to the punch.

4. The heat dissipation device according to claim 3, wherein a distance exists between the body portion and the first cover body or the second cover body.

5. The heat dissipation device according to claim 1, further comprising:
   an outer cover, configured to selectively close or leave the second cover body.

6. A heat dissipation device, comprising:
   an enclosure, comprising a first cover body and a second cover body that are opposite to each other, wherein the second cover body comprises an opening;
   a connective member, located in the enclosure and connected to one of the first cover body and the second cover body;
   a fan module, movably connected to the connective member, and moving between a first position and a second position relative to the enclosure, wherein when moving to the first position, the fan module is located in the enclosure, wherein the fan module further comprises a frame, the frame comprises an extension portion and a punch located on the extension portion, the connective member is slidably connected to the punch;
   a first stop member, connected to the connective member, wherein the extension portion is limited between the first cover body and the first stop member, or is limited between the second cover body and the first stop member; and
   a pushing member, disposed between the extension portion and the first stop member, and configured to push the extension portion to move the fan module toward the second position, wherein the connective member is connected to the second cover body.

7. The heat dissipation device according to claim 6, further comprising:
   an outer cover, configured to selectively close or leave the second cover body.

\* \* \* \* \*